United States Patent
Grider et al.

[11] Patent Number: 6,093,659
[45] Date of Patent: Jul. 25, 2000

[54] SELECTIVE AREA HALOGEN DOPING TO ACHIEVE DUAL GATE OXIDE THICKNESS ON A WAFER

[75] Inventors: Douglas T. Grider, McKinney; Vincent M. McNeil, Dallas, both of Tex.

[73] Assignee: Texas Instruments Incorporated, Dallas, Tex.

[21] Appl. No.: 09/047,713

[22] Filed: Mar. 25, 1998

Related U.S. Application Data

[60] Provisional application No. 60/040,905, Apr. 2, 1997.

[51] Int. Cl.[7] .......................... H01L 21/37; H01L 21/469
[52] U.S. Cl. .......................... 438/758; 438/766; 438/770
[58] Field of Search ...................................... 438/766, 770, 438/758

[56] References Cited

U.S. PATENT DOCUMENTS

| | | |
|---|---|---|
| 4,144,100 | 3/1979 | MacIver et al. |
| 4,743,563 | 5/1988 | Pfeister et al. |
| 4,748,131 | 5/1988 | Zietlow. |
| 4,748,134 | 5/1988 | Holland et al. |
| 4,948,742 | 8/1990 | Nishimura et al. ........................ 437/24 |
| 5,330,920 | 7/1994 | Soleimani et al. ........................ 437/24 |
| 5,385,630 | 1/1995 | Philipossian et al. ................... 156/628 |
| 5,460,693 | 10/1995 | Moslehi. |
| 5,480,828 | 1/1996 | Hsu et al. ................................. 437/56 |
| 5,614,421 | 3/1997 | Yang. |

OTHER PUBLICATIONS

Solid–State Electronics vol. 34, No. 8, pp. 889–892, "Properties of the Fluorine–Implanted Si–SiO(2) System," G.S. Virdi, C.M.S. Rauthan, B.C. Pathak and W.S. Khokle, 1991.
J. Electrochem Soc. vol. 139, No. 1, Jan. 1992, pp. 238–241, "Pre–Oxidation Fluorine Implantation into Si (Process–Related MOS Characteristics)," (Xie–Wen Wang, Artur Balasinski, and T.P. Ma).
Solid–State Electronics vol. 34, No. 8, pp. 889–892, 1991, "Properties of the Fluorine–Implanted Si–SiO$_2$ System," (G.S. Virdi, C.M.S. Rauthan, B.C. Pathak and W.S. Khokle).

*Primary Examiner*—John F. Niebling
*Assistant Examiner*—Josetta Jones
*Attorney, Agent, or Firm*—Jacqueline J. Garner; W. James Brady, III; Frederick J. Telecky, Jr.

[57] ABSTRACT

A method for forming an integrated circuit having multiple gate oxide thicknesses is disclosed herein. The circuit (10) is processed up to gate oxide formation. A pattern (36) is then formed exposing areas of the circuit where a thinner gate oxide (20) is desired. These areas are then implanted with a halogen species such as fluorine or chlorine, to retard oxidation. The pattern (36) is then removed and an oxidation step is performed. Oxidation is selectively retarded in areas (14) previously doped with the halogen species but not in the remaining areas (12). Thus, a single oxidation step may be used to form gate oxides (20,22) of different thicknesses.

17 Claims, 2 Drawing Sheets

SELECTIVE AREA HALOGEN DOPING TO ACHIEVE DUAL GATE OXIDE THICKNESS ON A WAFER

This application claims priority under 35 USC § 119 (e) (1) of provisional application No. 60/040,905, filed Apr. 2, 1997.

FIELD OF THE INVENTION

This invention generally relates to semiconductor processing and more specifically to forming multiple gate oxide thicknesses on a wafer.

BACKGROUND OF THE INVENTION

Because of aggressive downsizing of transistors for enhanced performance, reduced power and increased packing density, it is sometimes desirable to have the core logic of a integrated circuit operate at a different power supply voltage than some of the peripheral circuitry which is used to interface with external circuits. The aggressive scaling of gate oxide thicknesses to maintain performance can result in potentially large electric fields on the gate dielectric of the peripheral circuitry due to the fact that the peripheral circuitry interfaces with external circuitry that operates at higher voltages than the core logic. This can result in a serious reliability problem for the overall circuit. To avoid this, a gate oxide that is thicker in the peripheral circuitry than in the logic core is needed.

One prior art method for obtaining dual gate oxide thicknesses is called "split-gate". In one "split gate" process, an initial oxide is grown followed-by photolithographically masking areas where thick oxides are desired, then etching the grown oxide in areas where the thin oxide is required. The photoresist is then removed via a clean-up process that may include ashing and a final oxidation is performed to grow the thin oxide and anneal and slightly thicken the oxide already grown in the thick oxide areas. One of the primary drawbacks of this approach is a higher defect density (resulting in low yield) for the thicker gate oxide due to extra processing for the thicker oxide and exposure to resist and resist removal steps.

Another prior method for forming dual gate oxide thicknesses uses nitrogen implants into the silicon to retard oxidation rates in selected areas. Using this technique, areas with the nitrogen implant are grown to one thickness while those without the implant are grown thicker in a single oxidation step. While this method allows one to selectively control oxide thicknesses, there are several disadvantages. Nitrided oxides exhibit lower carrier mobility, higher oxide charge, and higher interface trap densities than pure thermal oxides. Since it is desirable to retard oxidation in the logic core, nitrogen would be implanted into this area where high performance is required, possibly resulting in degraded performance. Additionally, at higher doses, surface roughness can be severely degraded. This can pose reliability problems in addition to degrading performance.

SUMMARY OF THE INVENTION

A method for forming an integrated circuit having multiple gate oxide thicknesses is disclosed herein. The circuit is processed up to gate oxide formation. A pattern is then formed exposing areas of the circuit where a thinner gate oxide is desired. These areas are then implanted with a halogen species such as fluorine or chlorine, to retard oxidation. The pattern is then removed and an oxidation step is performed. Oxidation is selectively retarded in areas previously doped with the halogen species but not in the remaining areas. Thus, a single oxidation step may be used to form gate oxides of different thicknesses.

An advantage of the invention is forming a gate oxide of multiple thicknesses using a single oxidation step.

A further advantage of the invention is providing a process for forming a gate oxide of multiple thickness using a single oxidation step that improves performance rather than degrades it.

A further advantage of the invention is providing a process for forming a gate oxide of multiple thickness using a single oxidation step that improves reliability rather than degrades it.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a method for forming a logic device having a logic core and peripheral circuitry for which a dual thickness gate oxide layer is desired. It will be apparent to those of ordinary skill in the art that the benefits of the invention may be applied to other devices for which an oxide layer of multiple thicknesses is desired.

Figure 1:
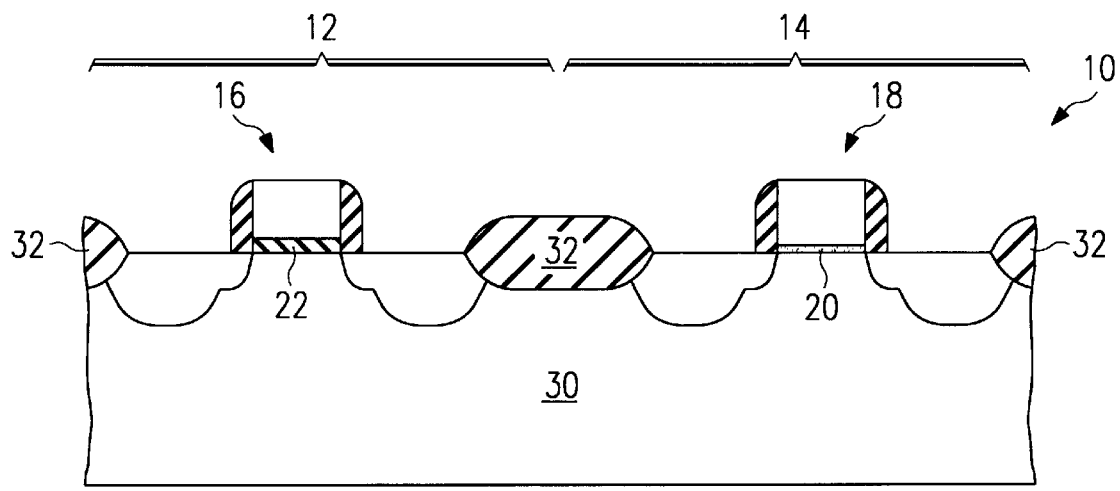
FIG. 1 is a cross-section diagram of a logic device according to the invention.

FIG. 1 is a cross-section of a portion of logic device 10. Logic device 10 includes a peripheral circuitry area 12 and a logic core 14. Peripheral circuitry area 12 may include, for example, input/output buffers and other circuitry for communicating with external devices. Logic core 14 contains the high performance circuitry for which a higher packing density and reduced power is desired. It is desired that transistors in area 12, such as transistor 16, operate at a higher operating or supply voltage (for compatibility with external devices) than transistors, such as transistor 18, in the logic core 14. Accordingly, transistors 16, in the peripheral circuitry area 12 have a thicker gate oxide that transistors 18 in the logic core 14.

According to the invention, a halogen species is introduced into the channel of the logic transistors 18 but not in the peripheral transistors 16 prior to oxide formation. Introduction of the halogen species retards oxidation. Therefore a single oxidation step may be used to form the thin gate oxide 20 in the logic core 14 and the thick gate oxide 22 in the peripheral circuitry area 12. In the final device, as shown in FIG. 1, the gate oxide 20 for transistors 18 in the logic core 14 contains the halogen species. The halogen species include chlorine Cl, Fluorine F, Bromine Br, and Iodine I, with Cl and F being the most prevalently used in the semiconductor industry.

Figure 2:
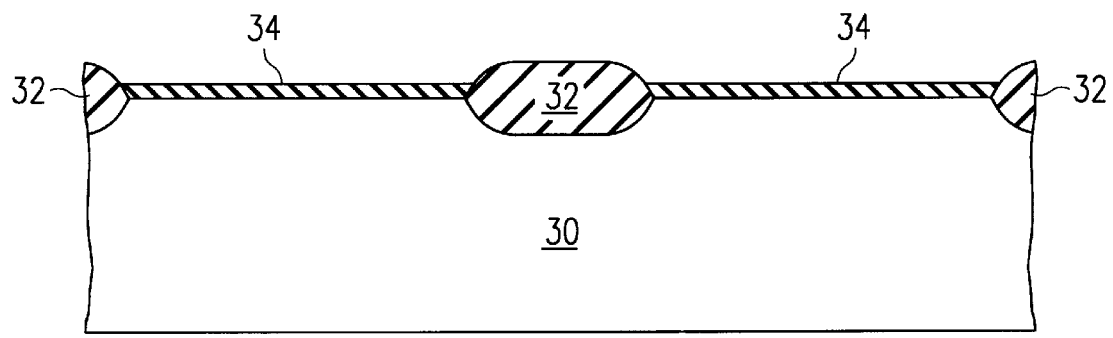
FIGS. 2–5 are cross-sectional diagram of the logic device of FIG. 1 at various stages of fabrication.

A method for forming logic device 10 will now be discussed with reference to FIGS. 2–5. The structure is processed using standard processing up to gate oxide formation as shown in FIG. 2. For example, isolation structures 32, such as LOCOS isolation or shallow trench isolation, are formed in a semiconductor body 30 to isolate subsequently formed transistors from each other. A dummy gate oxide 34 may also be formed. Standard pre-gate implants have also been performed, such as Vt adjust, punch-through, channel stop, and well implants (not shown).

Figure 3:
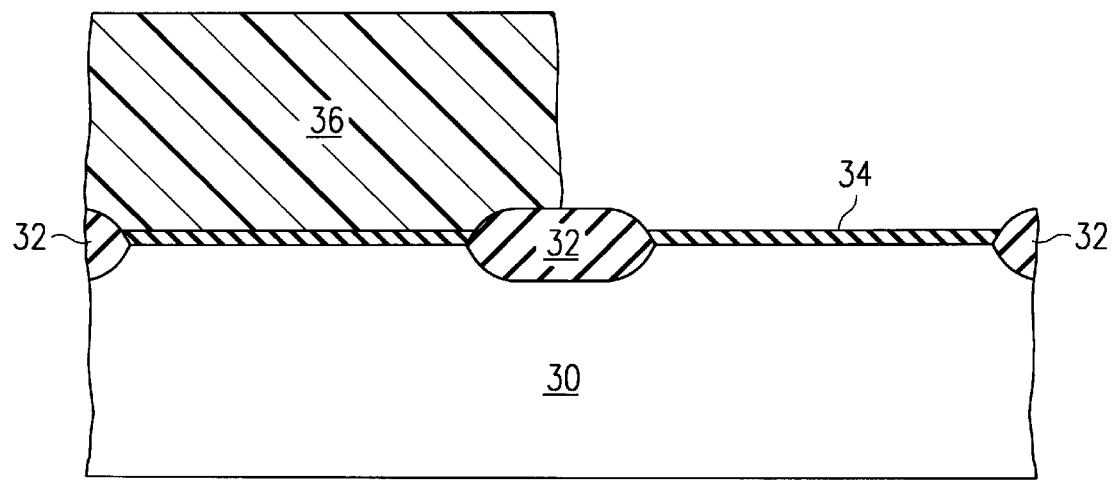

Referring to FIG. 3, a pattern 36 is formed over the structure. Pattern 36 covers areas of the device where thicker gate oxides are desired and exposes areas where thin gate oxides are desired. In this example, pattern 36 covers peripheral circuitry area 12 and not logic core 14. Pattern 36 comprises a masking material such as resist.

Figure 4:
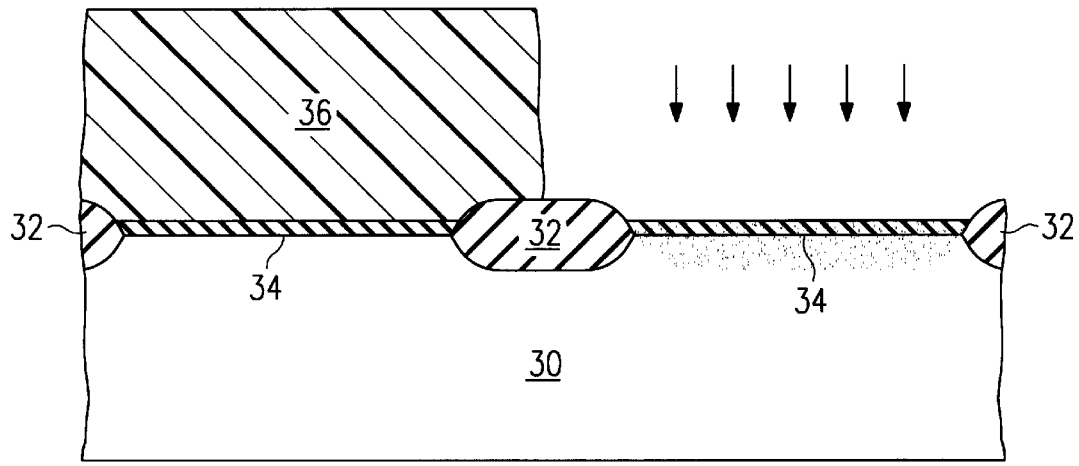

Referring to FIG. 4, a halogen species, such as Cl, F, Br, or I is then introduced into the exposed areas (logic core 14) of semiconductor body 30. There are a variety of methods for accomplishing this. For example, the halogen species may be ion implanted through dummy gate oxide 34 into semiconductor body 30. Other methods include vapor phase techniques such as HMDS vapor prime, plasma techniques such as HBr+Cl2 plasmas, and plasma immersion ion implantation (PIII). Other methods, as long as they do not attack pattern 36, are equally applicable.

For ion implantation, it is more advantageous to not remove dummy gate oxide 34 until after the introduction of the halogen species. However, for some other methods, such as vapor phase techniques, it is preferable to remove dummy gate oxide 34 prior to the introduction of the halogen species.

The species may be introduced through a variety of chemistries. Examples include, but are not limited to, NF3, HCl, CF4, CCl4, HBr, or Cl2. The chemistry may be a gas, liquid, or plasma depending on the implantation method used. The chemistry chosen is preferably not organic and does not include an impurity that may negatively impact the performance of the transistor such as BF3.

The dose of the halogen species is preferably low to avoid gate oxide integrity problems and to avoid unacceptably enhancing the boron penetration from a subsequently formed gate electrode through the gate oxide and into the channel of a transistor. Doses on the order of 1E12 to 1E14 may be used. The preferred embodiment uses fluorine or chlorine at a dose on the order of 5E12.

While the prior art method of introducing nitrogen has been shown degrade performance, fluorinated and chlorinated oxides, with small quantities of these species, exhibit improved reliability and performance over pure thermal oxides. Small additions of fluorine improve radiation hardness, hot carrier reliability, mobility and drive current of transistors. Chlorine also improves radiation hardness.

Figure 5:
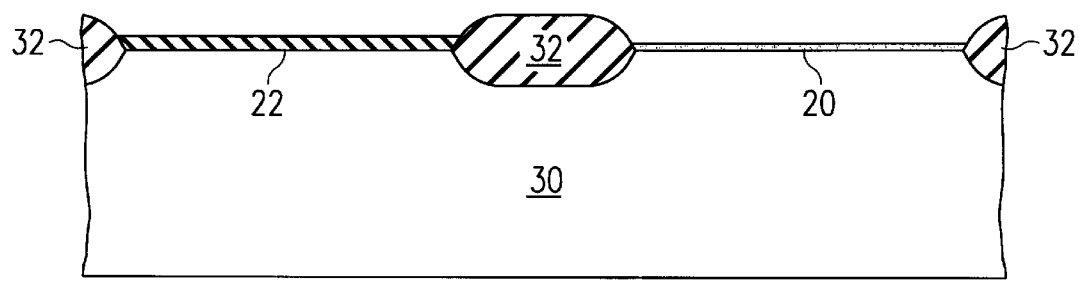

If dummy gate oxide 34 has not already been removed, it and pattern 36 are removed after the introduction of the halogen species. A pre-gate clean-up is then typically performed, followed by a single oxidation step. The results of a single oxidation step are shown in FIG. 5. The halogen species retards the oxidation growth in the logic core 14. As a result, gate oxide 20 in the logic core 14 is thinner than gate oxide 22 in the peripheral circuitry area 12. The difference in thickness depends largely on the dose of the halogen species. A dose on the order of 5E12 can result in a gate oxide thickness difference on the order of 2X. For example, the gate oxide thickness may be on the order of 40 Å in the logic core 14 and on the order of 80 Å in the peripheral circuitry area 12. Of course the thickness in the peripheral circuitry may be determined in the conventional manner of adjusting the oxidation step parameters, such as duration. The relationship in gate oxide thickness between the logic core and peripheral circuitry is then determined by the halogen species dose.

Because a single oxidation step can be used, additional heat treatments and etches such as those used in prior art "split-gate" approaches can be avoided. Thus, the invention's approach results in a lower defect density by virtue of never exposing the gate oxide to any potentially harmful etches and cleans.

Processing then continues in the desired manner. For example, conventional techniques may then be used to form polysilicon gate electrodes, source/drain regions, and various interconnections between transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the dose of the halogen species may be varied using more than one pattern to achieve more than two different gate oxide thicknesses. In addition, a second introduction of halogen species into the high Vt transistors may be performed after oxidation to increase the oxide thickness in order to achieve an even greater thickness differential between the thin and thick gate oxides. It is therefore intended that the appended claims encompass any such modifications or embodiments.

What is claimed is:

1. A method for forming an oxide layer having multiple thicknesses, comprising the steps of:

forming a pattern on a semiconductor body to expose a first region of said semiconductor body;

introducing a halogen species into said first region of said semiconductor body using said pattern;

removing said pattern; and oxidizing said semiconductor body to form an oxide layer thereon, wherein said oxide layer is thinner in said first region.

2. The method of claim 1, wherein said halogen species comprises fluorine.

3. The method of claim 1, wherein said halogen species comprises chlorine.

4. The method of claim 1, wherein said halogen species is introduced to a dose in the range of 1E12 to 1E14.

5. The method of claim 1, wherein said introducing step comprises the step of ion implanting said halogen species.

6. The method of claim 1, wherein said introducing step comprises the step of plasma immersion ion implantation of said halogen species.

7. The method of claim 1, wherein said introducing step comprises the step of vapor phase adsorption of said halogen species.

8. The method of claim 1, wherein said introducing step comprises the step of plasma excitation of said halogen species and surface adsorption.

9. A method of forming a logic device having a peripheral circuitry area and a logic core area, comprising the steps of:

forming a pattern on a semiconductor body to expose said logic core area and cover said peripheral-circuitry area;

introducing a halogen species into said logic core area using said pattern;

removing said pattern; and oxidizing said semiconductor body to form an oxide layer thereon, wherein said oxide layer is thinner in said logic core area than in said peripheral circuitry area.

10. The method of claim 9, wherein said halogen species comprises fluorine.

11. The method of claim 9, wherein said halogen species comprises chlorine.

12. The method of claim 9, wherein said halogen species is introduced to a dose in the range of 1E12 to 1E14.

13. The method of claim 9, wherein said introducing step comprises the step of ion implanting said halogen species.

14. The method of claim 9, wherein said introducing step comprises the step of plasma immersion ion implantation of said halogen species.

15. The method of claim 9, wherein said introducing step comprises the step of vapor phase adsoprtion of said halogen species.

16. The method of claim 9, wherein said introducing step comprises the step of plasma excitation of said halogen species and surface adsorption.

17. The method of claim 9, wherein said introducing step introduces a halogen chemistry selected from the group consisting of NF3, HCl, CF4, CCl4, HBr, Cl2, or combinations thereof.

* * * * *